(12) United States Patent
Tominaga et al.

(10) Patent No.: US 10,818,698 B2
(45) Date of Patent: Oct. 27, 2020

(54) ACTIVE MATRIX SUBSTRATE AND DISPLAY DEVICE AND TOUCH PANEL DISPLAY DEVICE INCLUDING SAME

(71) Applicant: SHARP KABUSHIKI KAISHA, Sakai, Osaka (JP)

(72) Inventors: Masakatsu Tominaga, Sakai (JP); Masahiro Yoshida, Sakai (JP); Yoshihito Hara, Sakai (JP); Isao Ogasawara, Sakai (JP); Yasuhiro Mimura, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 0 days.

(21) Appl. No.: 16/308,418

(22) PCT Filed: Jun. 7, 2017

(86) PCT No.: PCT/JP2017/021159
§ 371 (c)(1),
(2) Date: Dec. 7, 2018

(87) PCT Pub. No.: WO2017/213178
PCT Pub. Date: Dec. 14, 2017

(65) Prior Publication Data
US 2019/0221585 A1  Jul. 18, 2019

(30) Foreign Application Priority Data

Jun. 9, 2016  (JP) .................................. 2016-115582

(51) Int. Cl.
*G06F 3/044* (2006.01)
*G02F 1/1368* (2006.01)
*G02F 1/1345* (2006.01)
*G02F 1/1333* (2006.01)
(Continued)

(52) U.S. Cl.
CPC .......... *H01L 27/124* (2013.01); *G02F 1/1333* (2013.01); *G02F 1/1345* (2013.01);
(Continued)

(58) Field of Classification Search
CPC ...... G06F 3/0412; G06F 1/3265; G06F 3/044; G02F 1/134336
See application file for complete search history.

(56) References Cited

U.S. PATENT DOCUMENTS

2008/0137022 A1    6/2008  Komeno et al.
2009/0262095 A1*  10/2009  Kinoshita ............... G06F 3/044
                                                              345/174
(Continued)

FOREIGN PATENT DOCUMENTS

JP    2006-220832 A    8/2006
JP    2008-145461 A    6/2008
(Continued)

*Primary Examiner* — Jennifer Mehmood
*Assistant Examiner* — James S Nokham
(74) *Attorney, Agent, or Firm* — ScienBiziP, P.C.

(57) ABSTRACT

Provided is an active matrix substrate in which differences of parasitic capacitances among lead-out lines connected with signal lines can be reduced, as well as a display device and a touch-panel-equipped display device including the same. An active matrix substrate includes: a plurality of signal lines S1 to S9 arranged so as to be parallel to one another in a display area provided on a substrate; and a plurality of lead-out lines L1 to L9 that are connected with the signal lines S1 to S9 outside the display area. Outside the display area, the lead-out lines L1 to L9 are separately arranged in at least three layers, the three layers being a bottommost line layer that is formed at the position closest to the substrate, a topmost line layer that is formed at the position farthest from the substrate, and an intermediate line layer that is formed between the bottommost line layer and the topmost line layer. A capacitance is formed between the (Continued)

signal line S3 connected with the lead-out line L3 provided in the bottommost line layer, and the signal line S4 connected with the lead-out line L4 provided in the topmost line layer.

17 Claims, 10 Drawing Sheets

(51) Int. Cl.
    *H01L 29/786*     (2006.01)
    *H01L 27/12*     (2006.01)
    *H01L 27/32*     (2006.01)
    *G02F 1/1362*     (2006.01)
    *G06F 3/041*     (2006.01)

(52) U.S. Cl.
    CPC ........ *G02F 1/1368* (2013.01); *G02F 1/13338* (2013.01); *G02F 1/136286* (2013.01); *G06F 3/044* (2013.01); *G06F 3/0412* (2013.01); *H01L 27/323* (2013.01); *H01L 27/3276* (2013.01); *H01L 29/786* (2013.01); *G02F 2001/136222* (2013.01)

(56) References Cited

U.S. PATENT DOCUMENTS

| | | | |
|---|---|---|---|
| 2010/0194699 A1* | 8/2010 | Chang | G06F 3/0412 345/173 |
| 2011/0141042 A1* | 6/2011 | Kim | G06F 3/0412 345/173 |
| 2011/0176097 A1* | 7/2011 | Shiromoto | G02F 1/134336 349/123 |
| 2012/0001881 A1* | 1/2012 | Miyake | G06F 1/3265 345/209 |
| 2013/0147724 A1 | 6/2013 | Hwang et al. | |
| 2013/0169567 A1* | 7/2013 | Shih | G06F 3/0412 345/173 |
| 2013/0271675 A1* | 10/2013 | Misaki | G06F 3/044 349/12 |
| 2014/0071064 A1* | 3/2014 | Cho | G06F 3/044 345/173 |
| 2014/0111471 A1* | 4/2014 | Zhao | G06F 3/0412 345/174 |
| 2014/0176492 A1* | 6/2014 | An | G06F 3/044 345/174 |
| 2014/0176886 A1* | 6/2014 | Yoshida | G02F 1/134309 349/110 |
| 2015/0009166 A1* | 1/2015 | Saitoh | G06F 3/0412 345/173 |

FOREIGN PATENT DOCUMENTS

| | | |
|---|---|---|
| JP | 2010-175700 A | 8/2010 |
| JP | 2012-032799 A | 2/2012 |
| JP | 2013-122752 A | 6/2013 |
| WO | 2013-021866 A1 | 2/2013 |

* cited by examiner

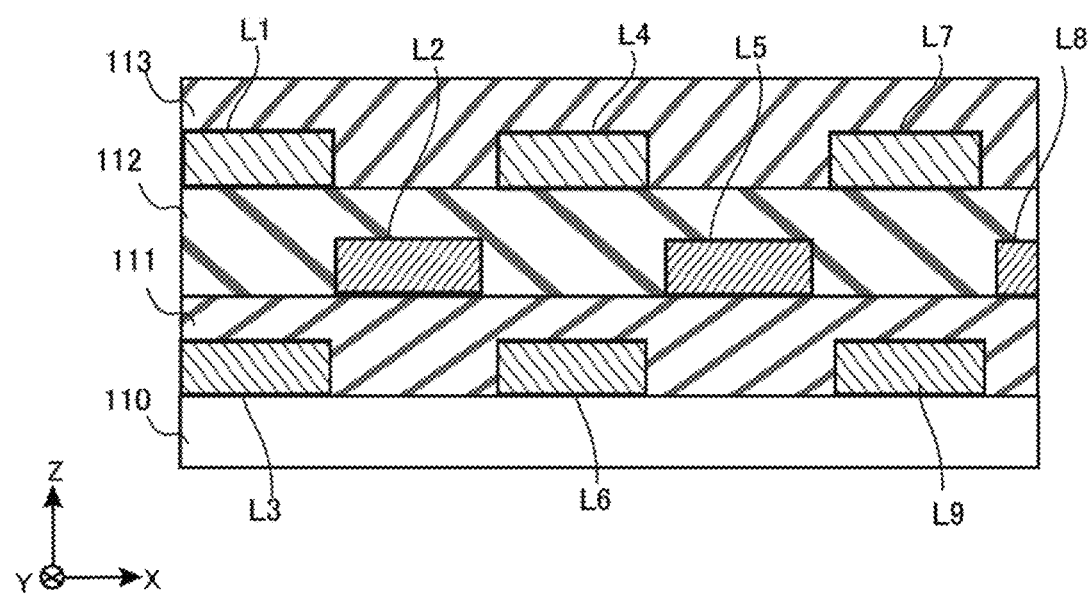
F I G. 13

ACTIVE MATRIX SUBSTRATE AND DISPLAY DEVICE AND TOUCH PANEL DISPLAY DEVICE INCLUDING SAME

TECHNICAL FIELD

The present invention relates to an active matrix substrate, as well as a display device and a touch-panel-equipped display device including the same.

BACKGROUND ART

In recent years, in order to display high-definition images, the number of signal lines such as gate lines and data lines has increased, and along with this, the number of lead-out lines that are connected to these signal lines and extended to outside the display area has increased, too. WO2013/021866 discloses a display device in which lead-out lines for gate lines and data lines are separately arranged in three line layers so that the frame area outside the display area is narrowed. In the configuration disclosed in the above patent document, among three lines, a lead-out line provided in a line layer close to a base substrate (hereinafter referred to as a first lead-out line), and a lead-out line provided in a line layer far from the base substrate (hereinafter referred to as a third lead-out line) are arranged so as to overlap with an insulating layer being interposed therebetween.

SUMMARY OF THE INVENTION

In the case of WO2013/021866, the first lead-out line and the third lead-out line have a distance therebetween, and a parasitic capacitance exists between these lead-out lines is therefore small. The lead-out line provided in an intermediate line layer (hereinafter referred to as a second lead-out line) is adjacent to the first lead-out line and the third lead-out line with insulating layers being interposed, and therefore have greater parasitic capacitances as compared with the first lead-out line and the third lead-out line. Consequently, loads on the signal line connected with the second lead-out line are greater than those for the other lead-out lines, whereby signal delays tend to occur.

It is an object of the present invention to provide an active matrix substrate in which differences of parasitic capacitances among lead-out lines connected with signal lines can be reduced, and to provide a display device and a touch-panel-equipped display device including the same.

An active matrix substrate in one embodiment of the present invention includes: a substrate; a plurality of signal lines arranged so as to be parallel to one another in a display area provided on the substrate; and a plurality of lead-out lines that are connected with the signal lines outside the display area on the substrate, and supply voltage signals to the signal lines connected thereto, wherein, outside the display area, the lead-out lines are separately arranged in at least three layers, the three layers being a bottommost line layer that is formed at the position closest to the substrate, a topmost line layer that is formed at the position farthest from the substrate, and an intermediate line layer that is formed between the bottommost line layer and the topmost line layer, and the lead-out lines provided in the bottommost line layer, the intermediate line layer, and the topmost line layer are arranged so as to overlap, and a capacitance is formed between the signal line connected with the lead-out line provided in the bottommost line layer, and the signal line connected with the lead-out line provided in the topmost line layer.

With the present invention, differences of parasitic capacitances among lead-out lines connected with signal lines can be reduced.

BRIEF DESCRIPTION OF DRAWINGS

FIG. 13 is a cross-sectional view illustrating an exemplary arrangement of lead-out lines in Embodiment 3.

MODE FOR CARRYING OUT THE INVENTION

Figure 1:
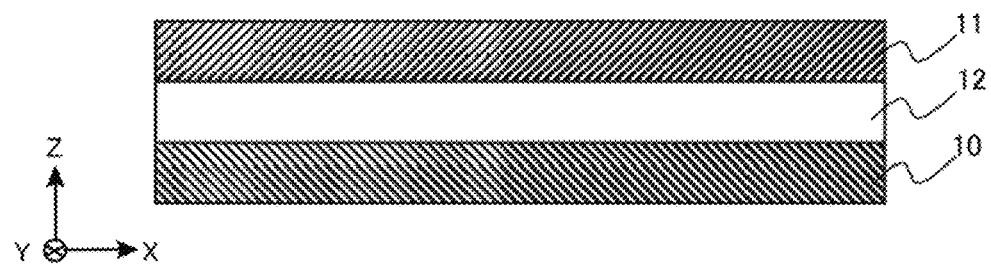
FIG. 1 is a cross-sectional view of a display device in Embodiment 1.

An active matrix substrate in one embodiment of the present invention includes: a substrate; a plurality of signal lines arranged so as to be parallel to one another in a display area provided on the substrate; and a plurality of lead-out lines that are connected with the signal lines outside the display area on the substrate, and supply voltage signals to the signal lines connected thereto, wherein, outside the display area, the lead-out lines are separately arranged in at least three layers, the three layers being a bottommost line layer that is formed at the position closest to the substrate, a topmost line layer that is formed at the position farthest from the substrate, and an intermediate line layer that is formed between the bottommost line layer and the topmost line layer, and the lead-out lines provided in the bottommost line layer, the intermediate line layer, and the topmost line layer are arranged so that corresponding ones of the lead-out lines overlap with one another, and a capacitance is formed between one of the signal lines connected with a corresponding one of the lead-out lines provided in the bottommost line layer, and one of the signal lines connected with a corresponding one of the lead-out lines provided in the topmost line layer (the first configuration).

According to the first configuration, the active matrix substrate includes a plurality of signal lines arranged in the display area on the substrate, and a plurality of lead-out lines that are connected with the signal lines outside the display area. The lead-out lines are separately arranged in at least three layers, i.e., the bottommost line layer, the intermediate line layer, and the topmost line layer. The lead-out lines arranged in the bottommost line layer, the intermediate line layer, and the topmost line layer overlap with one another, and a capacitance is formed between one of the signal lines connected to one of the lead-out lines arranged in the bottommost line layer, and one of the signal lines connected to one of the lead-out lines arranged in the topmost line layer. This causes a difference to decrease between a parasitic capacitance of the signal line connected to the lead-out line arranged in the intermediate line layer, and parasitic capacitances of the signal lines connected to the lead-out lines arranged in the bottommost line layer and the topmost line layer. As a result, variations in the loads on the signal lines decrease, whereby display defects due to a signal delay in a particular signal line are reduced.

The first configuration may be further characterized in that the capacitance is made in a direction vertical with respect to the substrate (the second configuration).

With the second configuration, spaces for forming capacitances can be reduced, while differences among parasitic capacitances of the signal lines are reduced.

The second configuration may be further characterized in further including a metal film that overlaps with one of the signal lines connected with a corresponding one of the lead-out lines provided in the bottommost line layer, and one of the signal lines connected with a corresponding one of the lead-out lines provided in the topmost line layer, the metal film being connected with either said one signal line connected with the lead-out line provided in the bottommost line layer, or said one signal line connected with the lead-out line provided in the topmost line layer, wherein the capacitance is made between said one signal line connected with the lead-out line provided in the bottommost line layer, and said one signal line connected with the lead-out line provided in the topmost line layer, via the metal film (the third configuration).

With the third configuration, the spaces for making capacitances can be reduced.

The first configuration may be further characterized in that the capacitance is made in a direction horizontal with respect to the substrate (the fourth configuration).

With the fourth configuration, differences among respective parasitic capacitances of the signal lines can be reduced, without an additional step of making capacitances.

The fourth configuration may be further characterized in that one of the signal lines connected with a corresponding one of the lead-out lines provided in the bottommost line layer, and one of the signal lines connected with a corresponding one of the lead-out lines provided in the topmost line layer are provided so as to be closer to each other, than to one of the signal lines connected with a corresponding ones of the lead-out lines provided in the intermediate line layer (the fifth configuration).

According to the fifth configuration, each signal line connected with the lead-out line arranged in the bottommost line layer and each signal line connected with the lead-out line arranged in the topmost line layer are arranged so as to be close to each other. An additional step for making a capacitance between these signal lines is therefore unnecessary.

Any one of the second to fifth configurations may be further characterized in further including a seal-forming area for arranging a sealing member outside the display area, wherein the capacitance is made in an area outside the display area, other than the seal-forming area (the sixth configuration).

With the sixth configuration, an area for irradiating light for curing the sealing member can be ensured.

Any one of the first to sixth configurations may be further characterized in that the voltage signal is a voltage signal in accordance with image data of an image to be displayed in the display area; to one of the signal lines that is connected with a corresponding one of the lead-out lines in the intermediate line layer, a voltage signal is supplied, the voltage signal having a polarity opposite to that of voltage signals supplied to ones of the signal lines that are arranged adjacent, in the horizontal direction of the substrate, to said one of the signal lines connected with the lead-out line in the intermediate line layer, and that are connected with corresponding ones of the lead-out lines provided in the bottommost line layer and the topmost line layer, respectively; and the capacitance is made between ones of the signal lines to which voltage signals having different polarities are supplied, respectively, and that are connected with ones of the lead-out lines provided in the bottommost line layer and the topmost line layer, respectively (the seventh configuration).

According to the seventh configuration, to a certain signal line connected with the lead-out lines arranged in the intermediate line layer, a voltage signal having a polarity opposite to that of voltage signals supplied to signal lines that are adjacent to the foregoing signal line and that are connected to lead-out lines provided in the bottommost line layer and the topmost line layer, respectively. A capacitance is made between signal lines to that are connected with lead-out lines arranged in the bottommost line layer and the topmost line layer, respectively, to which voltage signals having different polarities are supplied. The capacitance can be therefore greater, as compared with a case where a capacitance is made between signal lines to which voltage signals having the same polarity are supplied and that are connected to lead-out lines arranged in the bottommost line layer and the topmost line layer, respectively. Thereby, differences among parasitic capacitances of the signal lines can be reduced further.

An active matrix substrate in one embodiment of the present invention includes: a substrate; a plurality of signal lines arranged so as to be parallel with one another in a display area provided on the substrate; and a plurality of lead-out lines that are connected with the signal lines outside the display area on the substrate, respectively, and supply voltage signals to the signal lines connected thereto, wherein, outside the display area, the lead-out lines are separately arranged in at least three layers, the three layers being a bottommost line layer that is formed at the position closest to the substrate, a topmost line layer that is formed at the position farthest from the substrate, and an intermediate line layer that is formed between the bottommost line layer and the topmost line layer; and the lead-out lines provided in the bottommost line layer and the topmost line layer so that corresponding ones of the lead-out lines overlap with each other, and the lead-out lines provided in the intermediate line layer are provided at such positions as to overlap with neither of the lead-out lines provided in the bottommost line layer and the topmost line layer (the eighth configuration).

According to the eighth configuration, the active matrix substrate includes a plurality of signal lines arranged in the display area on the substrate, and a plurality of lead-out lines connected with the signal lines outside the display area. The lead-out lines are separately arranged in at least three layers, i.e., a bottommost line layer, an intermediate line layer, and a topmost line layer. The lead-out lines provided in the bottommost line layer and the topmost line layer overlap with each other, while the lead-out line provided in the intermediate line layer does not overlap with any lead-out line provided in the bottommost line layer and the topmost line layer. Differences among parasitic capacitances are therefore further reduced, as compared with a case where the lead-out lines provided in the bottommost line layer, the intermediate line layer, and the topmost line layer overlap with one another. As a result, variations in the load on the signal lines decrease, whereby display defects due to a signal delay in a particular signal line are reduced.

The eighth configuration may be further characterized in further including a seal-forming area for arranging a sealing member outside the display area, wherein, in an area outside the display area, other than the seal-forming area, the lead-out lines provided in the bottommost line layer and the topmost line layer so that corresponding ones of the lead-out lines overlap with each other, and the lead-out lines provided in the intermediate line layer are provided at such positions as to overlap with neither of the lead-out lines provided in the bottommost line layer and the topmost line layer (the ninth configuration).

With the ninth configuration, an area for irradiating light for curing the sealing member can be ensured.

The eighth or ninth configuration may be further characterized in that the voltage signal is a voltage signal in accordance with image data of an image to be displayed in the display area, and to one of the signal lines that is connected with a corresponding one of the lead-out lines in the intermediate line layer, a voltage signal is supplied, the voltage signal having a polarity opposite to that of voltage signals supplied to ones of the signal lines that are arranged adjacent, in the horizontal direction of the substrate, to said one of the signal lines connected with the lead-out line in the intermediate line layer, and that are connected with corresponding ones of the lead-out lines provided in the bottommost line layer and the topmost line layer, respectively (the tenth configuration).

According to the tenth configuration, to the signal line connected with the lead-out line provided in the intermediate line layer, a voltage signal is supplied, the voltage signal having a polarity opposite to that of voltage signals supplied to the signal lines that are arranged adjacent to said signal line and are connected with the lead-out lines arranged in the bottommost line layer and the topmost line layer. Since voltage signals having the same polarity are supplied to the lead-out lines arranged in the bottommost line layer and the topmost line layer, capacitive coupling occurring to these lead-out lines is small. Besides, since the lead-out line arranged in the intermediate line layer do not overlap with the lead-out lines that are respectively arranged in the bottommost line layer and the topmost line layer, parasitic capacitances can be reduced, even if voltage signals having opposite polarities are supplied.

A display device in one embodiment of the present invention includes: the active matrix substrate having any one of the first to tenth configurations; a counter substrate that is arranged so as to be opposed to the active matrix substrate, and has a color filter; and a liquid crystal layer interposed between the active matrix substrate and the counter substrate (the eleventh configuration).

With the eleventh configuration, variations in the loads on the signal lines decrease, whereby display defects due to a signal delay in a particular signal line are reduced.

A display device in one embodiment of the present invention includes: the active matrix substrate having any one of the first to sixth, eighth, and ninth configurations; a counter substrate that is arranged so as to be opposed to the active matrix substrate; and a light emission layer interposed between the active matrix substrate and the counter substrate the active matrix substrate (the twelfth configuration).

With the twelfth configuration, variations in the loads on the signal lines decrease, whereby display defects due to a signal delay in a particular signal line are reduced.

A touch-panel-equipped display device in one embodiment of the present invention includes: the active matrix substrate having any one of the first to tenth configurations, wherein the active matrix substrate further includes: a plurality of pixel electrodes; a plurality of counter electrodes arranged so as to be opposed to the pixel electrodes, respectively; and a plurality of counter electrode signal lines that are connected with the counter electrodes, respectively, and to which a voltage signal for detecting a touch position is supplied (the thirteenth configuration).

With the thirteenth configuration, variations in the loads on the signal lines in the active matrix substrate decrease, whereby display defects due to a signal delay in a particular signal line are reduced.

Embodiment 1

The following description describes embodiments of the present invention in detail, while referring to the drawings. Identical or equivalent parts in the drawings are denoted by the same reference numerals, and the descriptions of the same are not repeated. To make the description easy to understand, in the drawings referred to hereinafter, the configurations are simply illustrated or schematically illustrated, or the illustration of a part of constituent members is omitted. Further, the dimension ratios of the constituent members illustrated in the drawings do not necessarily indicate the real dimension ratios.

FIG. 1 schematically illustrates a configuration of a display panel included in a display device in the present embodiment. The display panel 1 in the present embodiment includes an active matrix substrate 10, a counter substrate 11, and a liquid crystal layer 12 interposed between the active matrix substrate 10 & counter substrate 11. The display device includes a backlight (not shown) on the back side of the active matrix substrate 10.

Figure 2:
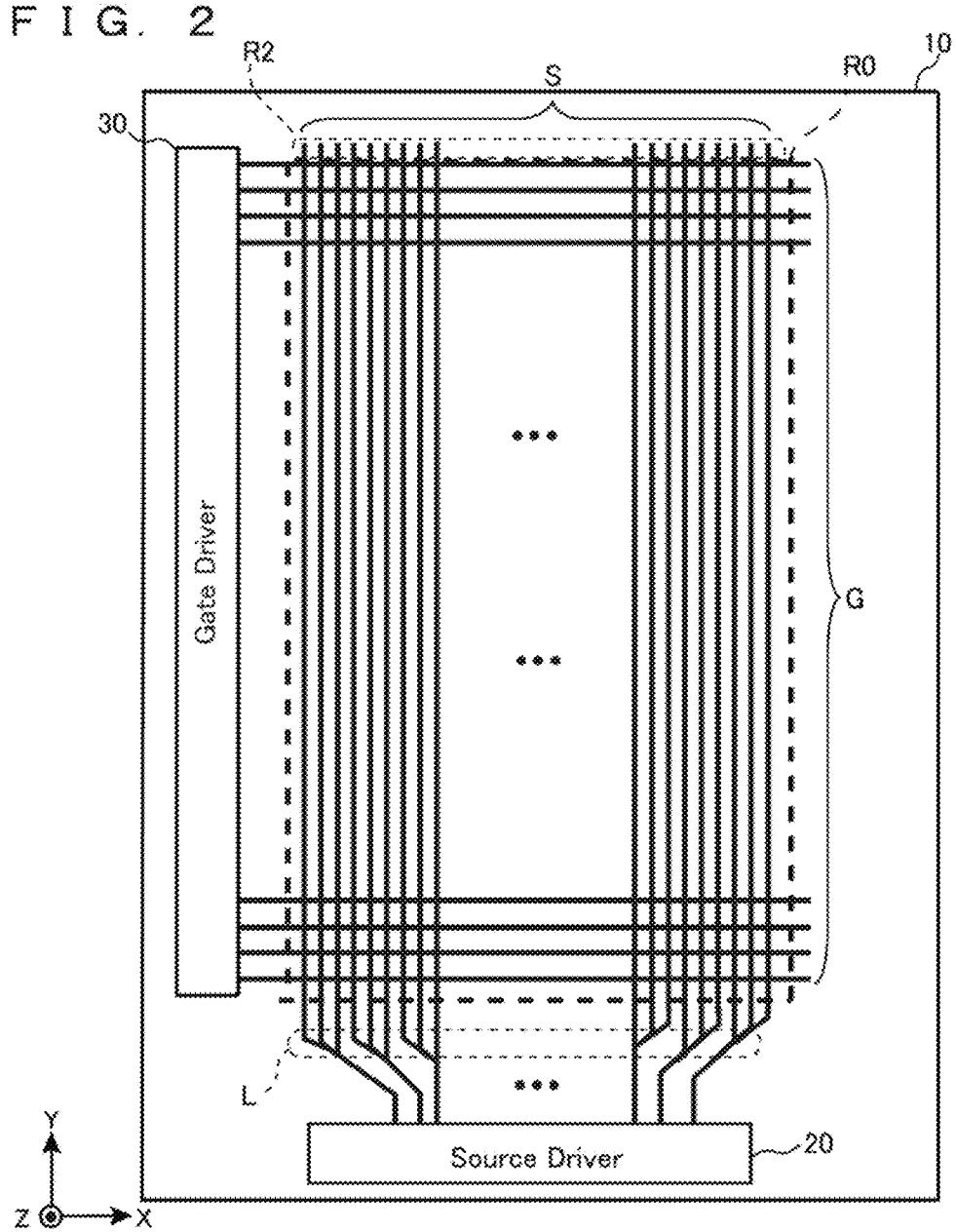
FIG. 2 schematically illustrates a schematic configuration of the active matrix substrate illustrated in FIG. 1.

FIG. 2 schematically illustrates a configuration of the active matrix substrate 10. The active matrix substrate 10 includes a plurality of gate lines G and a plurality of data lines S. The active matrix substrate 10 includes a plurality of pixels defined by the gate lines G and the data lines S, and an area where the pixels are formed is a display area R0 of the active matrix substrate 10.

In each pixel, a pixel electrode and a switching element are arranged. For example, a thin film transistor is used as the switching element, and the gate electrode, the source electrode, and the drain electrode of the thin film transistor are connected to the gate line G, the data line S, and the pixel electrode, respectively.

The active matrix substrate 10 includes a source driver 20 and a gate driver 30 in an area (frame area) outside the display area R0. The source driver 20 is connected with each data line S. and supplies voltage signals to the data line S in accordance with image data, respectively. The gate driver 30 is connected with each gate line G, and sequentially supplies a voltage signal to the gate lines G so as to scan the gate lines G.

The counter substrate 11 includes color filters (not illustrated) of, for example, three colors of red (R), green (G), blue (B), and common electrodes (not illustrated). The common electrodes are provided over an entirety of the display area R0 so as to be opposed to the pixel electrodes, for example.

The color filters of three colors are provided in correspondence to the pixel electrodes, and each pixel electrode functions as a subpixel of any one color among the colors R, G, and B. At the subpixel, a liquid crystal capacitor is made by the pixel electrode, the common electrode, and the liquid crystal layer 12 between the pixel electrode and the common electrode.

As illustrated in FIG. 2, the data lines S are connected with lead-out lines L that are provided in the frame area where the source driver 20 is provided. The lead-out lines L are connected with the source driver 20, and supply voltage signals supplied from the source driver 20 to the data lines S connected thereto.

Figure 3:
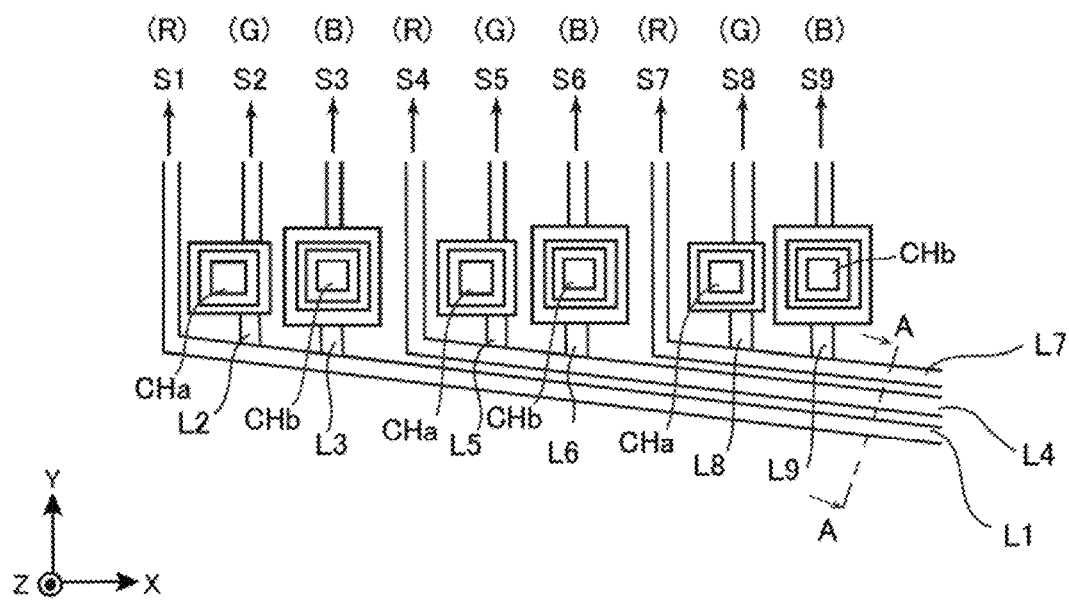
FIG. 3 is an enlarged diagram schematically illustrating a part of lead-out lines connected to data lines illustrated in FIG. 2.
Figure 4:
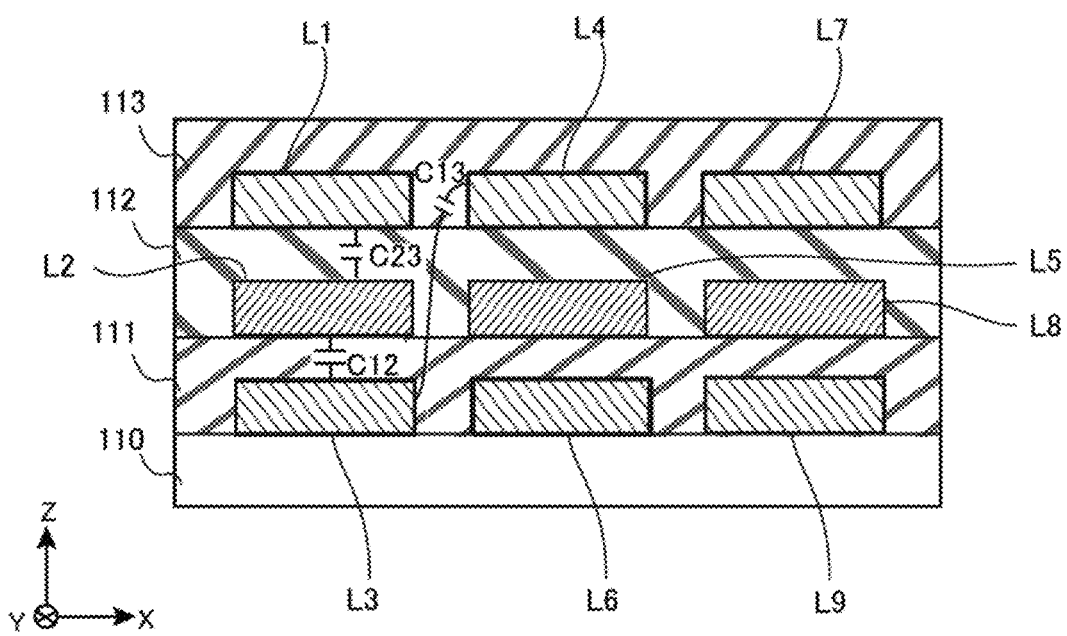
FIG. 4 is a schematic cross-sectional view of the active matrix substrate illustrated in FIG. 3, taken along line A-A.

FIG. 3 is an enlarged diagram schematically illustrating a part of lead-out lines L connected to data lines S illustrated in FIG. 2. The data lines S connected to the part of the lead-out lines L illustrated in FIG. 3 are referred to as data lines S1 to S9, respectively. In FIG. 3, the characters of "R", "G", and "B" described above the data lines S1 to S9 indicate the colors of the subpixels corresponding to the data lines S1 to S9, respectively. Further, FIG. 4 schematically illustrate a cross section taken along line A-A illustrated in FIG. 3.

As illustrated in FIG. 3, the data lines S1 to S9 are connected to the lead-out lines denoted by L1 to L9, respectively. The lead-out lines L1, L4, L7 are formed with a part of the data lines S1, S4, S7 extended to the frame area, and are located in the same layer as that of the data lines S1, S4, S7. Each of the lead-out lines L1, L4, L7 has a width of, for example, 4 µm. The distance between the lead-out lines L1 and L4, as well as the distance between the lead-out lines L4 and L7 are, for example, 3 µm.

The lead-out lines L2, L5, L8 are provided in a layer lower with respect to the data lines S2, S5, S8, and are connected with the data lines S2, S5, S8, respectively, at contact portions CHa. The lead-out lines L2, L5, L8 are made of metal films having conductivity. The lead-out lines L2, L5, L8 are formed in, for example, the same layer as that of the gate lines G. Each of the lead-out lines L2, L5, L8 has a width of, for example, 4 µm. The distance between the lead-out lines L2 and L5, as well as the distance between the lead-out lines L5 and L8 are, for example, 3 µm.

The lead-out lines L3, L6, L9 are provided in a layer lower with respect to the lead-out lines L2, L5, L8, and are connected with the data lines S3, S6, S9, respectively, at contact portions CHb. The lead-out lines L3, L6, L9 are made of metal films having conductivity. Each of the lead-out lines L3, L6, L9 has a width of, for example, 4 µm. The distance between the lead-out lines L3 and L6, as well as the distance between the lead-out lines L6 and L9 are, for example, 3 µm.

More specifically, as illustrated in FIG. 4, the lead-out lines L3, L6, L9 are formed on a base substrate 110. A first insulating film 111 is arranged so as to cover the lead-out lines L3, L6, L9, and the lead-out lines L2, L5, L8 are arranged so as to overlap with the lead-out lines L3, L6, L9 with the first insulating film 111 being interposed therebetween. A second insulating film 112 is arranged so as to cover the lead-out lines L2, L5, L8, and the lead-out lines L1, L4, L7 are arranged so as to overlap with the lead-out lines L2, 15, L8 with the second insulating film 112 being interposed therebetween. Further, a third insulating film 113 is arranged so as to cover the lead-out lines L1, L4, L7. In other words, every three lead-out lines L are separately arranged in three layers, respectively, and overlap with one another with the first insulating film 111 and the second insulating film 112 being interposed. As the first insulating film 111 and the second insulating film 112, for example, films each of which has a thickness of 200 nm to 800 nm and is made of silicon nitride ($SiN_x$) or silicon dioxide ($SiO_2$) can be used.

Hereinafter, the lead-out lines L are referred to as first lead-out lines, second lead-out lines, and third lead-out lines in the order in which the proximity to the base substrate 110 decreases. In other words, in this example, the lead-out lines L3, L6, L9 are the first lead-out lines, the lead-out lines L2, 15, L8 are the second lead-out lines, and the lead-out lines L1, L4, L7 are the third lead-out lines.

In a case where every three lead-out lines L are arranged so as to overlap with one another in the frame area in this way, a parasitic capacitance is made between the lead-out line corresponding to one certain data line S and the lead-out lines corresponding to the two data lines S adjacent to the foregoing certain data line S. In other words, the second lead-out line has a parasitic capacitance (C12+C23) between the same and the first lead-out line as well as the third lead-out line. In contrast, the first lead-out line has the parasitic capacitance (C12) between the same and the second lead-out line, as well as a parasitic capacitance (C13) between the same and the third lead-out line in an adjacent row. Likewise, the third lead-out line has the parasitic capacitance (C23) between the same and the second lead-out line, as well as a parasitic capacitance (C13) between the same and the first lead-out line in an adjacent row. The parasitic capacitance C13 is smaller than the parasitic capacitance (C12) or the parasitic capacitance (C13). Here, a parasitic capacitance is also made between a certain one of the second lead-out lines and another second lead-out line adjacent thereto. However, in a case where, for example, each of the first insulating film 111 and the second insulating film 112 have a thickness of 200 nm to 800 nm and the distance between adjacent ones of the second lead-out lines is 3 µm, the capacitance made between the second lead-out lines is sufficiently smaller than the parasitic capacitance (C12) or the parasitic capacitance (C13). Further, the capacitance between the first lead-out lines, or the capacitance between the third lead-out lines, is also sufficiently smaller than the parasitic capacitance (012) or the parasitic capacitance (C13).

In other words, the data line S connected to the second lead-out line is influenced by the parasitic capacitance (C12+C23) of the second lead-out line. The parasitic capacitance is greater than the parasitic capacitance having an influence on the data line S connected to the first lead-out line, or the parasitic capacitance having an influence on the data line S connected to the third lead-out line, that is, the parasitic capacitance of the first, or third lead-out line (C12+C13, or C23+C13). This causes a load on the data line S connected to the second lead-out line to be greater than that on the data line S connected to the first or third lead-out line, whereby the potential of the pixel corresponding to the data line S connected to the second lead-out line decreases, and a luminance difference occurs between this pixel and a pixel adjacent to the same. Such a display defect tends to appear in a case of column inversion driving, dot inversion driving, or Z-inversion driving. The following description describes potential changes occurring to the pixel in this case.

Figure 5:
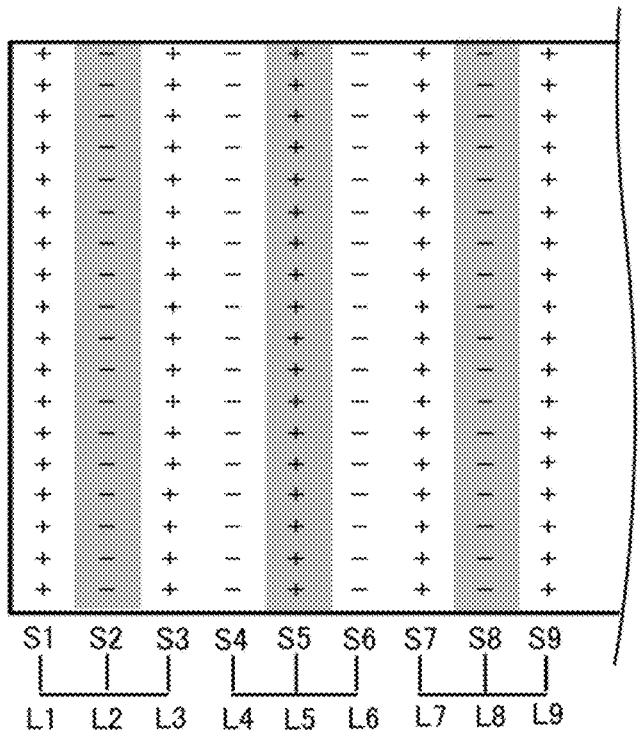
FIG. 5 is a schematic diagram for explaining the polarities of voltage signals supplied to the data lines illustrated in FIG. 2.
Figure 6:
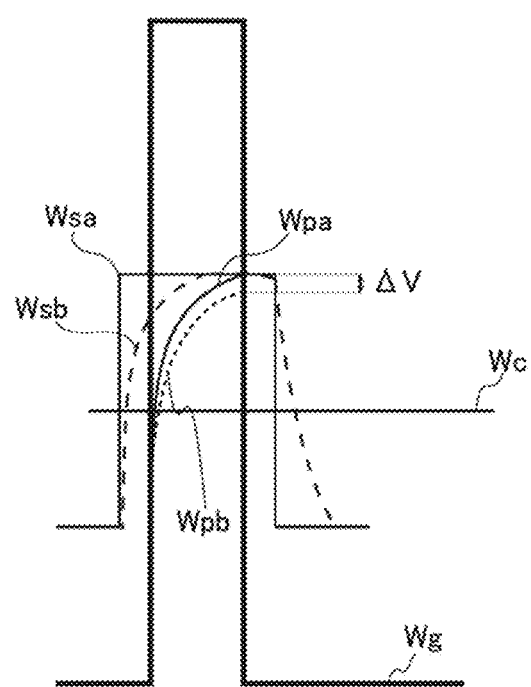
FIG. 6 is a waveform diagram for explaining the potential reduction at a pixel due the signal delay occurring at the data line.

FIG. 5 schematically illustrates a state in which, in one frame, data signals of opposite polarities are supplied to adjacent data lines S, respectively. FIG. 6 is a waveform diagram illustrating a voltage waveform at the pixel corresponding to the data line S connected to the first lead-out line or the third lead-out line, and a voltage waveform at the pixel corresponding the data line connected to the second lead-out line. In FIG. 6, the waveform Wg represents a voltage waveform at the gate line G, and the waveform Wc represents a voltage waveform at the common electrode. Further, the waveform Wsa represents a waveform at the data line S connected to the first or third lead-out line, the waveform Wpa represents a waveform at the pixel corresponding to this data line S. Still further, the waveform Wsb represents a voltage waveform at the data line S connected to the second lead-out line, and the waveform Wpb represents a voltage waveform at the pixel corresponding to this data line S.

As described above, the parasitic capacitance of the second lead-out line is greater than that of the first or third lead-out line. As illustrated in FIG. 6, therefore, the waveform Wsb is dull as compared with the waveform Wsa, and the waveform Wpb decreases by ΔV as compared with the waveform Wpa indicates that the potential of the pixel.

In other words, in the data lines S2, S5, S8 connected to the second lead-out lines L2, L5, L8, respectively (see FIG. 4), signals are delayed due to the parasitic capacitances of the second lead-out lines, as compared with the data lines S1, S3, S4, S6, S7, S9 connected to the first, third lead-out lines. The potentials of the pixels corresponding to the data lines S2, S5, S8 decreases more, as compared with the pixels corresponding to the data lines S1, S3, S4, S6, S7, S9, which results in that luminance differences occur between the pixels corresponding to the data lines S2, S5, S8 and the pixels corresponding to the data lines S1, S3, S4, S6, S7, S9.

The above-described phenomenon occurs due to the difference between the parasitic capacitance of the second lead-out line and the parasitic capacitance of the first or third lead-out line. In the present embodiment, therefore, a capacitance is increased between the data lines that are connected to the first lead-out line and the third lead-out line, and to which data signals having different polarities are supplied, whereby the difference between the parasitic capacitance of the second lead-out line and the parasitic capacitance of the first or third lead-out line is reduced. The following description describes Configuration Examples 1 to 4.

Configuration Example 1

Figure 7A:
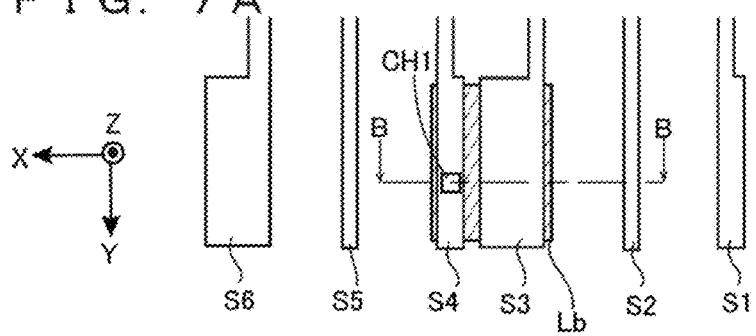
FIG. 7A schematically illustrates a structure of data lines of Configuration Example 1, the data lines being arranged in a frame area in Embodiment 1.
Figure 7B:
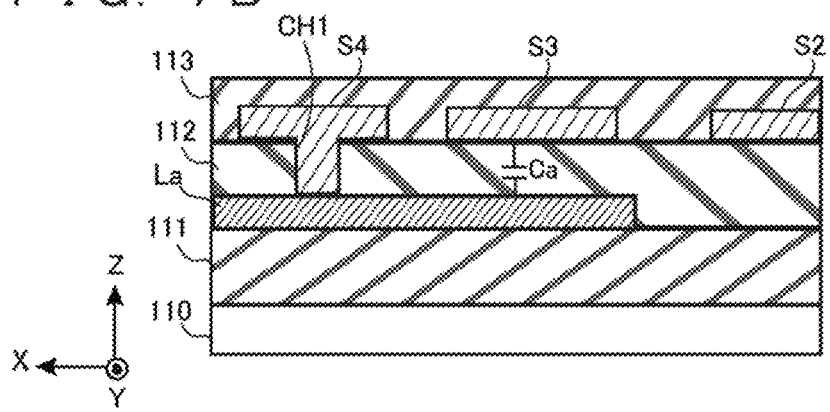
FIG. 7B is a schematic cross-sectional view of the active matrix substrate illustrated in FIG. 7A, taken along line B-B.

FIG. 7A is a schematic enlarged diagram illustrating a part of the data lines (the data lines S1 to S6) provided in the frame area R2 on the side opposite to the source driver 20 side in the active matrix substrate 10 illustrated in FIG. 2. FIG. 7B schematically illustrates a cross section taken along line B-B in FIG. 7A.

As illustrated in FIG. 7B, on the base substrate 110, the first insulating film 111 is provided, and on the first insulating film 111, a metal film La formed with the same material as that of the second lead-out lines is formed. Further, the second insulating film 112 is formed so as to cover the first insulating film 111 and the metal film La, and on the second insulating film 112, the data lines S2 to S4 are provided. The data lines S3 and the metal film La overlap, with the second insulating film 112 being interposed therebetween, and the data line S4 is connected with the metal film La via the contact hole CH1 provided in the second insulating film 112.

As illustrated in FIG. 5, data signals having polarities opposite to each other are supplied to the data line S3 connected with the first lead-out line L3, and the data lines S4 connected to the third lead-out line L4. With the configuration illustrated in FIGS. 7A and 7B, therefore, a capacitance Ca is made between the data line S4 and the data line S3 via the metal film La. In other words, the capacitance Ca is made in a direction vertical to the base substrate 110, between the data lines S4 and S3.

This causes the data line S3 to be influenced by the parasitic capacitance Ca between the data line S3 and the data line S4, in addition to the parasitic capacitance (C12+C13) of the first lead-out line L3. Likewise, this causes the data line S4 to be influenced by the parasitic capacitance Ca between the data line S4 and the data line S3, in addition to the parasitic capacitance (C23+C13) of the third lead-out line L4. As a result, the difference between the parasitic capacitance of the data line S2 connected to the second lead-out line L2 and the parasitic capacitance of the data line S3 connected to the first lead-out line L3 decreases, whereby the luminance difference between the pixels corresponding to these data lines to decrease.

It should be noted that the two data lines between which a capacitance is made are two data lines that are connected with the first and third lead-out line, respectively, and to which data signals having polarities opposite to each other are supplied. In other words, in the example illustrated in FIGS. 4, 5, capacitances are increased between the data lines S3 and S4, and between the data lines S6 and S7. The data lines S1 and S3 are connected to the first and third lead-out lines L3 and L1, respectively, but data signals having the same polarity are supplied to these data lines. The capacitive coupling between two data lines to which data signals having the same polarity are supplied is smaller than the capacitive coupling between the data lines S3 and S4, to which data signals having opposite polarities are supplied. In a case of column inversion driving, dot inversion driving, or Z-inversion driving, it is desirable that a capacitance is made between two data lines that are connected with the first and third lead-out lines, respectively, and to which data signals having opposite polarities are supplied.

Configuration Example 2

Figure 8A:
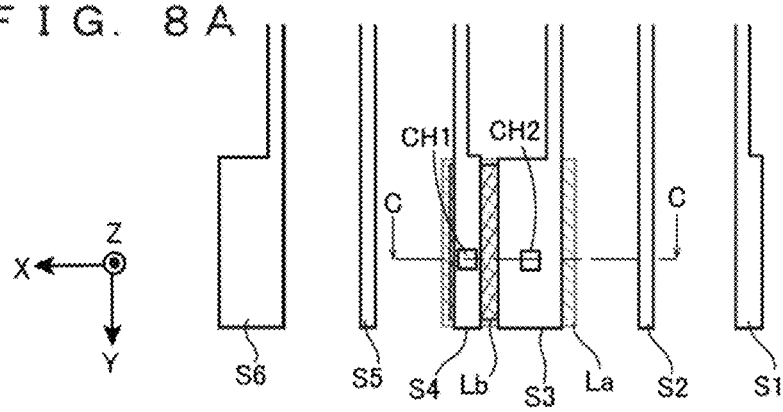
FIG. 8A schematically illustrates a structure of data lines of Configuration Example 2, the data lines being arranged in a frame area in Embodiment 1.
Figure 8B:
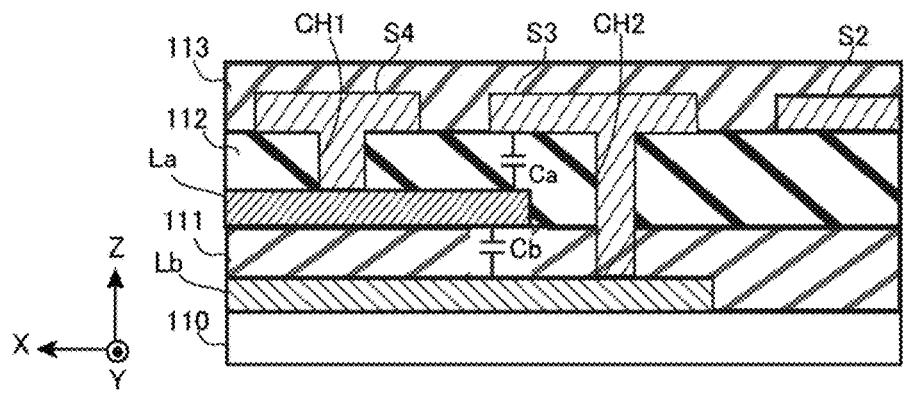
FIG. 8B is a schematic cross-sectional view of the active matrix substrate illustrated in FIG. 8A, taken along line C-C.

FIG. 8A illustrates exemplary data lines S1 to S6 provided in the frame area R2, as is the case with FIG. 7A. Further, FIG. 8B schematically illustrates a cross section taken along line C-C in FIG. 8A. In FIGS. 8A and 8B, the same constituent members as those in Configuration Example 1 described above are denoted by the same reference symbols as those in Configuration Example 1. The following description principally describes points different from those in Configuration Example 1.

As illustrated in FIG. 8B, in this example, a metal film Lb made of the same material as that of the first lead-out line is provided on the base substrate 110, and the first insulating film 111 is provided so as to cover the metal film Lb. The data line S3 overlaps with the metal film Lb, and is connected with the metal film Lb at the contact hole CH2 passing through the first insulating film 111 and the second insulating film 112. In addition, as is the case with Configuration Example 1, a metal film La is provided on the first insulating film 111, the metal film La and the data line S3 overlap with each other, and the data line S4 and the metal film La are connected with each other through the contact hole CH1. In this configuration, a capacitance Ca is made between the data line S3 and the metal film La, and at the same time, a capacitance Cb is made between the metal film La and the metal film Lb. In other words, the capacitance Ca and the capacitance Cb are made between the data lines S4 and S3, through the metal film La and the metal film Lb. With this configuration, a greater capacitance can be increased between the data lines S3 and S4, without a large area being needed, as compared with Configuration Example 1.

Configuration Example 3

Figure 9A:
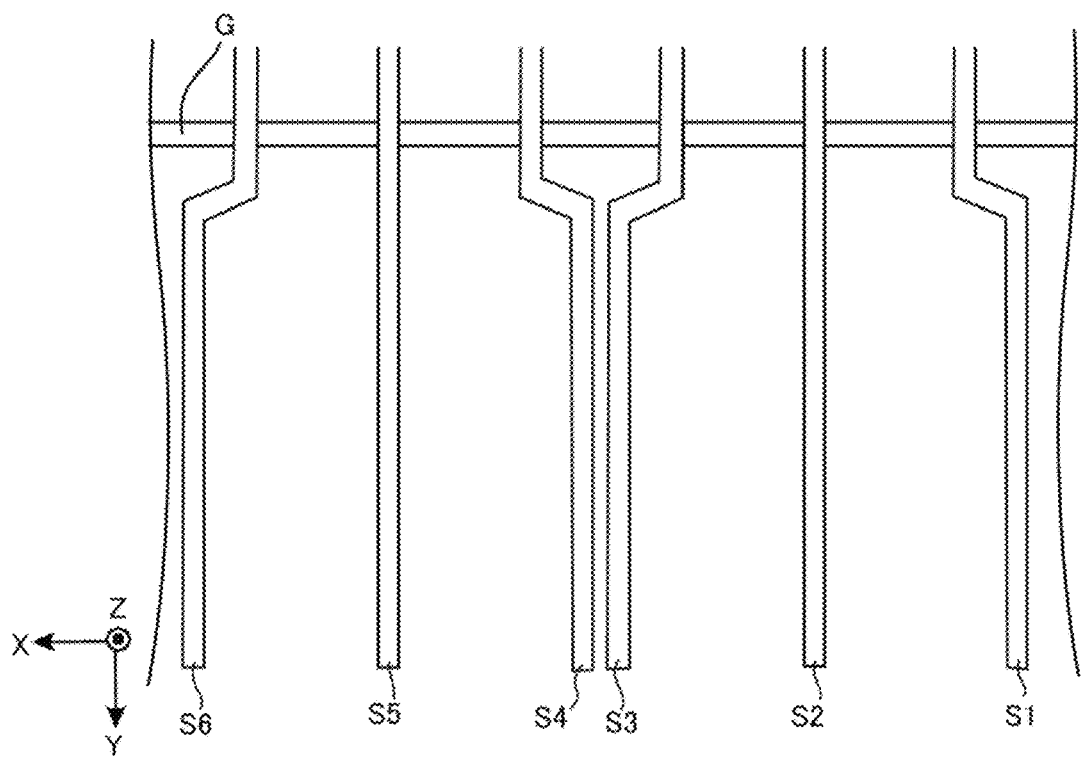
FIG. 9A schematically illustrates a structure of data lines of Configuration Example 3, the data lines being arranged in a frame area in Embodiment 1.

FIG. 9A illustrates exemplary data lines S1 to S6 provided in the frame area R2, as is the case with Configuration Example 1. As illustrated in FIG. 9A, the data lines S3 and S4 are bent so that the space between the data lines S3 and S4 is narrower than the space between the data lines S3 and S2, and the space between the data lines S4 and S5.

This configuration causes capacitive coupling to occur between the data lines S3 and S4. In other words, in this example, a capacitance is increased between the data lines S3 and S4 in the horizontal direction with respect to the base substrate 110. As a result, the difference between the parasitic capacitance of the data line S2 connected to the second lead-out line, and the parasitic capacitance of the data line S4 or S3 connected to the first or third lead-out lines, can be reduced. The data line S at which a capacitance is increased, however, is not limited to the data lines S3 and S4. The data lines S that are connected to the first, third lead-out lines and to which voltage signals having opposite polarities are supplied are formed in the same manner as that described above.

Configuration Example 4

Figure 9B:
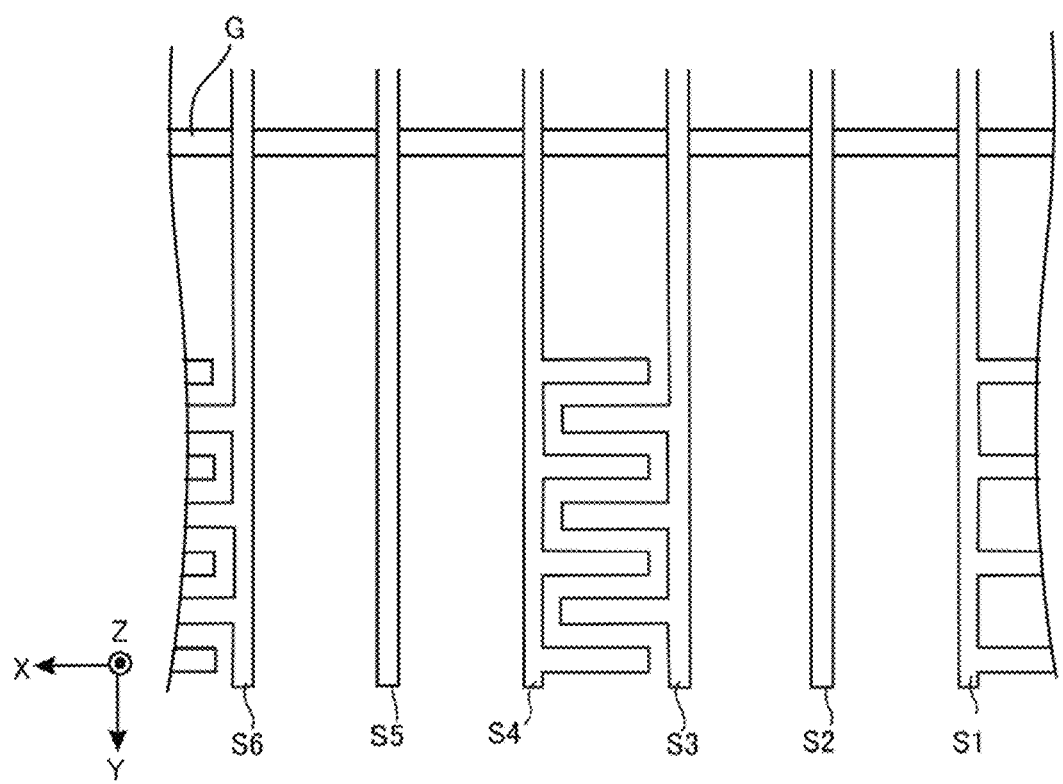
FIG. 9B schematically illustrates a structure of data lines of Configuration Example 4, the data lines being arranged in a frame area in Embodiment 1.

FIG. 9B illustrates a configuration example in which a capacitance between the data lines S3 and S4 in the frame area R2 is adjusted, as is the case with Configuration Example 1. The configuration example illustrated is different from Configuration Example 3 in the shape of the data line that adjusts a capacitance. As illustrated in FIG. 9B, in the present configuration example, the data lines S3 and S4 are arranged in such a manner that the parts thereof in the frame area have comb-like shapes, and the teeth of one and the teeth of the other are nested in each other. The data line S that forms a capacitance, however, is not limited to the data lines S3 and S4. Data lines S that are connected to the first and third lead-out lines and to which voltage signals having opposite polarities are supplied are formed so as to have the same configuration as that described above.

With this configuration, a capacitance is increased between the data lines S3 and S4, in a direction horizontal with respect to the base substrate 110. Consequently, the difference between the parasitic capacitance of the data line S2 connected to the second lead-out line, and the parasitic capacitance of the data line S4 or S3 connected to the first or third lead-out line can be reduced.

Figure 10:
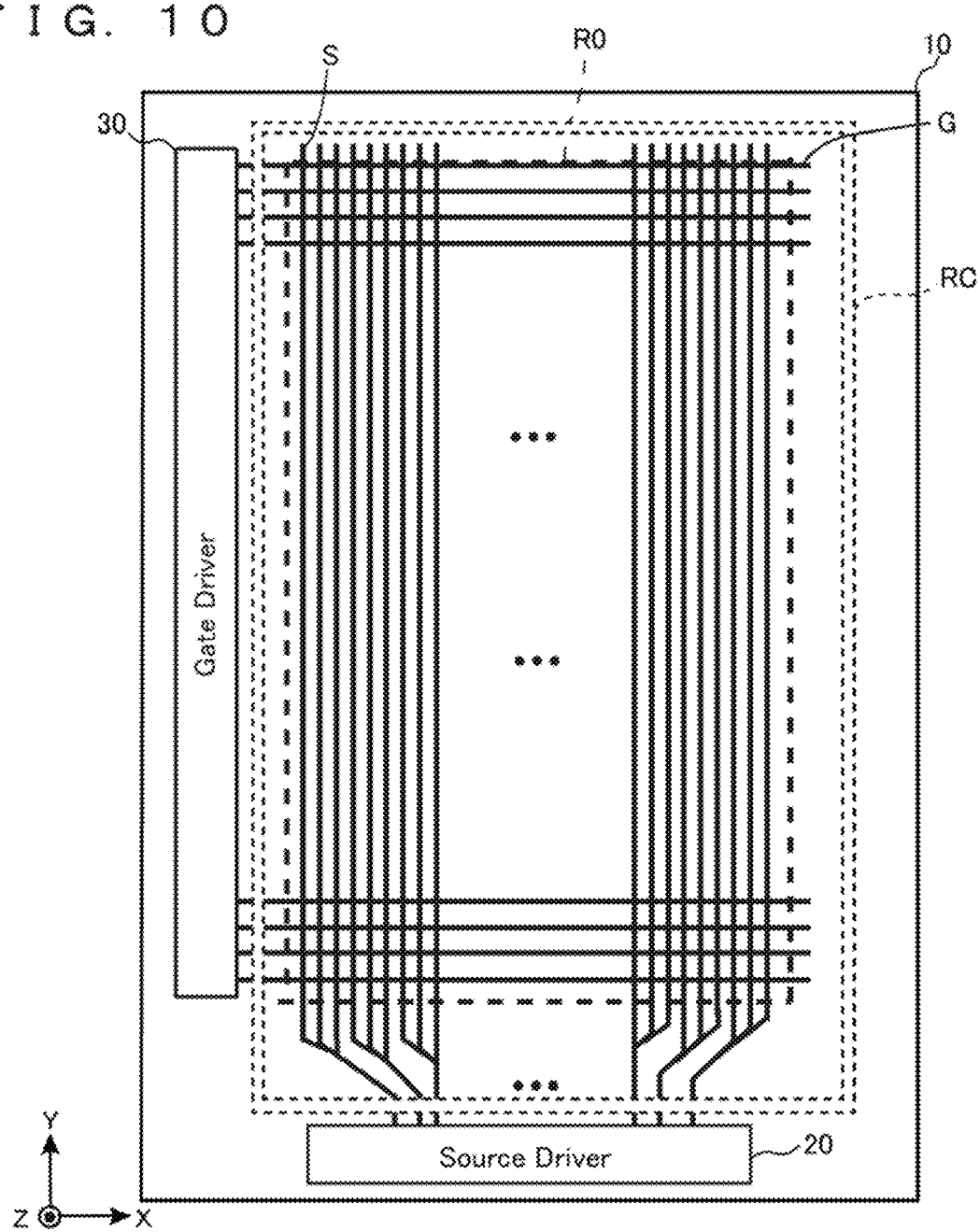
FIG. 10 schematically illustrates a sealing-formed area provided in an active matrix substrate.

Incidentally, from the viewpoint of layout, the configurations of Configuration Examples 1 to 4 described above are preferably provided in the frame area R2 on a side opposite to the source driver 20, in which no lead-out line is arranged and the degree of freedom in design is high. In contarast, from the viewpoint of reducing a difference in the way the voltage waveform of the data line becomes dull, the configurations are preferably provided in an area closer to a part where a difference occurs to the parasitic capacitance of the data line, that is, the frame area on the source driver 20 side. Further, the configurations of Configuration Examples 1 to 4 described above are preferably not provided in a seal-forming area where a sealing member for bonding the active matrix substrate 10 and the counter substrate 11 to each other is provided. The seal-forming area, for example, as illustrated in FIG. 10, is provided in a broken-line area RC, which surrounds the gate lines G and the data lines S, in the frame area outside the display area R0. In a case where a photocurable resin or a photo-thermosetting resin is used as a sealing member, if a configuration of Configuration Example 3 or Configuration Example 4 is arranged in a seal-forming part, a sufficient area to be irradiated with light (for example, ultraviolet light) for curing the sealing member cannot be ensured in some cases.

Embodiment 2

Embodiment 1 is described with reference to an example in which every three lead-out lines L are arranged separately in three layers, respectively. In contrast, the present embodiment is described with reference to an example in which every four lead-out lines L are arranged separately in four layers, respectively.

Figure 11A:
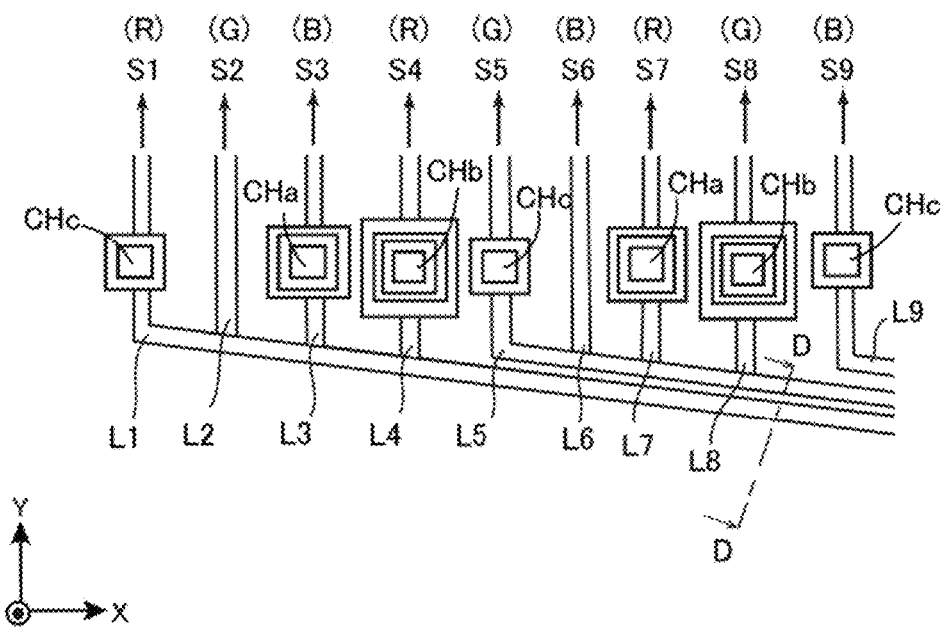
FIG. 11A is an enlarged diagram schematically illustrating a part of connection between data lines and lead-out lines in Embodiment 2.
Figure 11B:
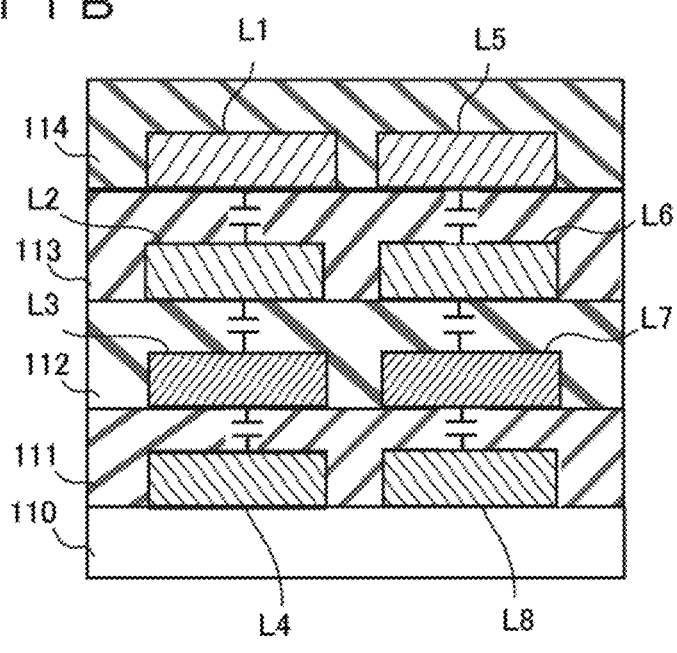
FIG. 11B is a schematic cross-sectional view of the active matrix substrate illustrated in FIG. 11A, taken along line D-D.

FIG. 11A is an enlarged diagram schematically illustrating parts of lead-out lines L connected with a part of data lines S illustrated in FIG. 2. Further, FIG. 11B schematically illustrates a cross section taken along line D-D illustrated in FIG. 11A. In FIGS. 11A and 11B, constituent members identical to those in Embodiment 1 are denoted by the same reference symbols as those in Embodiment 1.

The lead-out lines L1 to L9 connected to the data lines S1 to S9, as is the case with Embodiment 1, are illustrated in FIG. 11A, whereas the way of connection of the lead-out lines is different from that in Embodiment 1. The following description describes points different from those in Embodiment 1.

The lead-out lines L2, L6 are formed with the data lines S2, S6 extended to the frame area, and are formed in the same layer as that of the data lines S. In this example, the lead-out lines L2, L6 are the third lead-out lines.

The lead-out lines L3, L7 are provided in a layer lower with respect to the third lead-out lines, and are connected with the data lines S3, S7, respectively, at the contact portions CHa. In this example, the lead-out lines L3, L7 are the second lead-out lines.

The lead-out lines L4, L8 are provided in a layer lower with respect to the second lead-out lines, and are connected with the data lines S4, S8, respectively, at the contact portions CHb. In this example, the lead-out lines L4, L8 are the first lead-out lines.

Further, the lead-out lines L1, L5 are arranged on the third insulating film 113, and are connected with the data lines S1, S5 at the contact portions CHc. Hereinafter the lead-out lines L1, L5 are referred to as fourth lead-out lines. In other words, the fourth lead-out lines L1, L5 are provided in a layer upper with respect to the data lines S. In addition, a fourth insulating film 114 is formed so as to cover the fourth lead-out lines L1, L5.

In this way, in the present embodiment, the four lead-out lines L1 to L4 are arranged so as to overlap with one another, and so do the four lead-out lines L5 to L8. In this case, for example, the second and third lead-out lines L2 and L3 are arranged between the first and fourth lead-out lines L1 and L4, thereby having greater parasitic capacitances that are made between the same and other lead-out lines, as compared with parasitic capacitances that are made between the same and the first, fourth lead-out lines L1, L4. In the present embodiment, therefore, a capacitance is made between the data lines S connected with the first and fourth lead-out lines, in order to reduce the difference between a parasitic capacitance of the data line S connected to the second, third lead-out line, and a parasitic capacitance of the data line S connected to the first, fourth lead-out line.

Figure 12A:
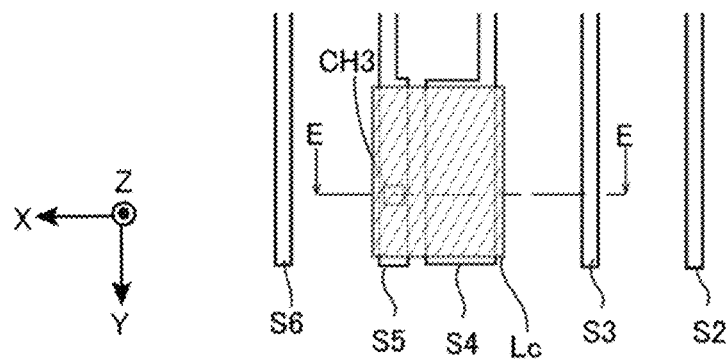
FIG. 12A schematically illustrates a structure of data lines arranged in a frame area in Embodiment 2.
Figure 12B:
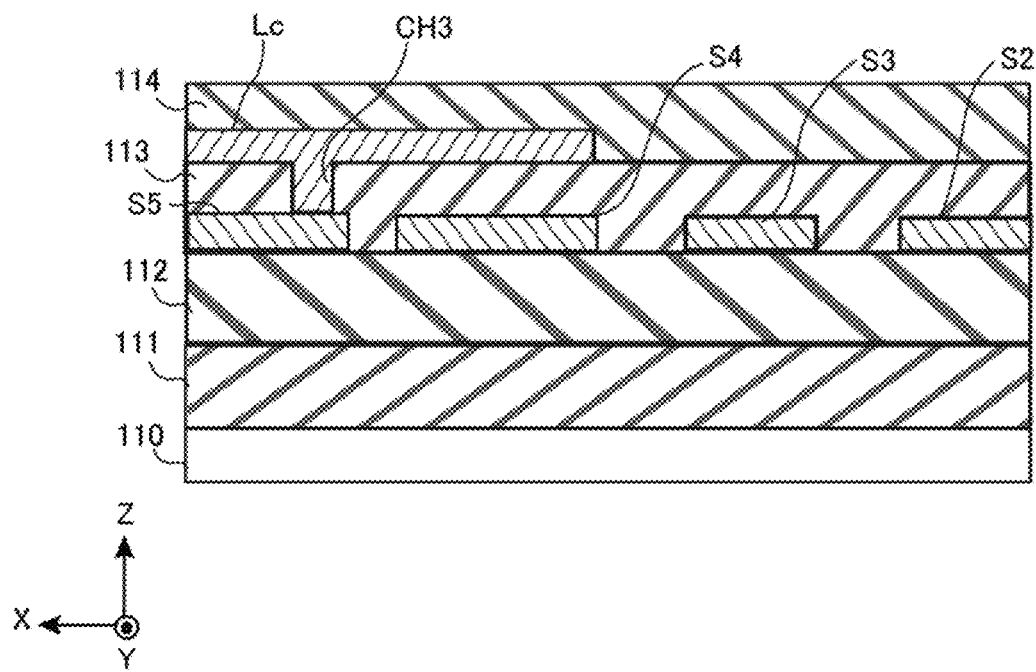
FIG. 12B is a schematic cross-sectional view of the active matrix substrate illustrated in FIG. 12A, taken along line E-E.

FIG. 12A is an enlarged diagram schematically illustrating the data lines S2 to S6 provided in the frame area R2. FIG. 12B schematically illustrates a cross section taken along line E-E in FIG. 12A.

As illustrated in FIG. 12B, the first insulating film 111 is arranged on the base substrate 110, and the second insulating film 112 is arranged on the first insulating film 111. Then, on the second insulating film 112, the data lines S2 to S5 are arranged, and the third insulating film 113 is arranged so as to cover the data lines S2 to S5. On the third insulating film 113, the metal film Lc is made of the same material as that of the fourth lead-out line, and the fourth insulating film 114 is arranged on the third insulating film 113 so as to cover the metal film Lc. The data line S4 and the metal film Lc overlap with each other with the third insulating film 113 being interposed therebetween, and the data line S5 is connected with the metal film Lc through the contact hole CH3 provided in the third insulating film 113.

This causes a capacitance Cc to be made between the data lines S4 and S5 via the metal film Lc. The parasitic capacitance of the data line S4, therefore, is a sum of the capacitance Cc and the parasitic capacitance between the first lead-out line L4 and the second lead-out line L3. In addition, the parasitic capacitance of the data line S5 is a sum of the capacitance Cc and the parasitic capacitance between the fourth lead-out line L4 and the third lead-out line L6. Accordingly, the difference between the parasitic capacitance of the data line connected to the second, third lead-out line, and the parasitic capacitance of the data line connected to the first, fourth lead-out line decreases. As a result, variations in the loads on the data lines S are reduced, whereby luminance differences occurring among the pixels are reduced.

Embodiment 3

Embodiments 1 and 2 are described with reference to an exemplary configuration in which a capacitance is made between a lead-out line arranged in a topmost layer, which is farthest from the base substrate 110, and a lead-out line arranged in a bottommost layer, which is closest to the base substrate 110, whereby variations in parasitic capacitances of data lines are reduced. The present embodiment is described with an example in which variations in parasitic capacitances of data lines are reduced with use of a configuration different from the configuration of Embodiment 1.

FIG. 13 is a cross-sectional view illustrating an example in which the lead-out lines L are separately arranged in three layers. In FIG. 13, constituent members identical to those in Embodiment 1 are denoted by the same reference symbols as those in Embodiment 1.

As illustrated in FIG. 13, the lead-out lines L1 to L9 connected with the data lines S1 to S9 are separately arranged in three layers, as is the case with Embodiment 1, but the positions in the X axis direction of the second lead-out lines L2, L5, L8 are offset with respect to the positions of the first and third lead-out lines L1, L3, L4, L6, L7, L9. In other words, the present embodiment is different from Embodiment 1 in the point that the second lead-out lines L2, L5, L8 do not overlap with the first and third lead-out lines L1, L3, L4, L6, L7, L9.

As illustrated in FIG. 5, voltage signals having a polarity opposite to that for the adjacent data lines are supplied to the data lines S2, S5, S8 connected to the second lead-out lines L2, L5, L8. In other words, voltage signals having the same polarity are supplied to every two data lines, i.e., the data lines S1 and S3 adjacent to the data line S2, the data lines S4 and S6 adjacent to the data line S5, and the data lines S7 and S9 adjacent to the data line S8. In a case where three lead-out lines are arranged so as to overlap with one another as illustrated in FIG. 4 in conjunction with Embodiment 1, therefore, a greater load due to a parasitic capacitance is applied to a data line connected to the second lead-out line, which is arranged in the middle, as compared with data lines connected to the first and third lead-out lines.

In contrast, in the present embodiment, as illustrated in FIG. 13, the first lead-out lines L3, L6, L9 and the third lead-out lines L1, L4, L7 overlap, while the second lead-out lines L2, L5, L8 do not overlap with these first and third lead-out lines. As compared with Embodiment 1, therefore, a capacitance made between the second lead-out line and the first and third lead-out lines is small. Further, since voltage signals having the same polarity are supplied to the data lines connected to the first lead-out lines and the data lines connected to the third lead-out lines, and the first lead-out lines and the third lead-out lines are arranged with two insulating films, i.e., the first insulating film 111 and the second insulating film 112, being interposed therebetween, capacitive coupling hardly occurs between the first and third lead-out lines. As compared with a case where the first, second, and third lead-out lines are arranged so as to overlap with one another, therefore, differences among the parasitic capacitances of the lead-out lines are reduced, whereby luminance differences occurring among the pixels can be reduced.

Incidentally, in the present embodiment, the configuration in which the first lead-out lines and the third lead-out lines overlap, and the second lead-out lines do not overlap with the first and third lead-out lines is preferably formed outside the display area, except for the seal-forming area RC (see FIG. 10), for the same reason as that in the case of Embodiment 1.

Examples of the display device according to the present invention are described above, but the display device according to the present invention is not limited to the configurations of the above-described embodiments, and may have a variety of modified configurations. The modification examples are described below.

Modification Example 1

The active matrix substrates of the above-described embodiments may be applied to a touch-panel-equipped display device. In this case, in the touch-panel-equipped display device, the active matrix substrate may be provided with elements necessary for detecting a touch position, so as to have a function of image display and a function of touch position detection. The present modification example is described with reference to an example in which the method for driving liquid crystal molecules is the horizontal electric field driving method, and to realize the horizontal electric field driving method, and pixel electrodes and counter electrodes (common electrodes) are formed in the active matrix substrate.

Figure 14:
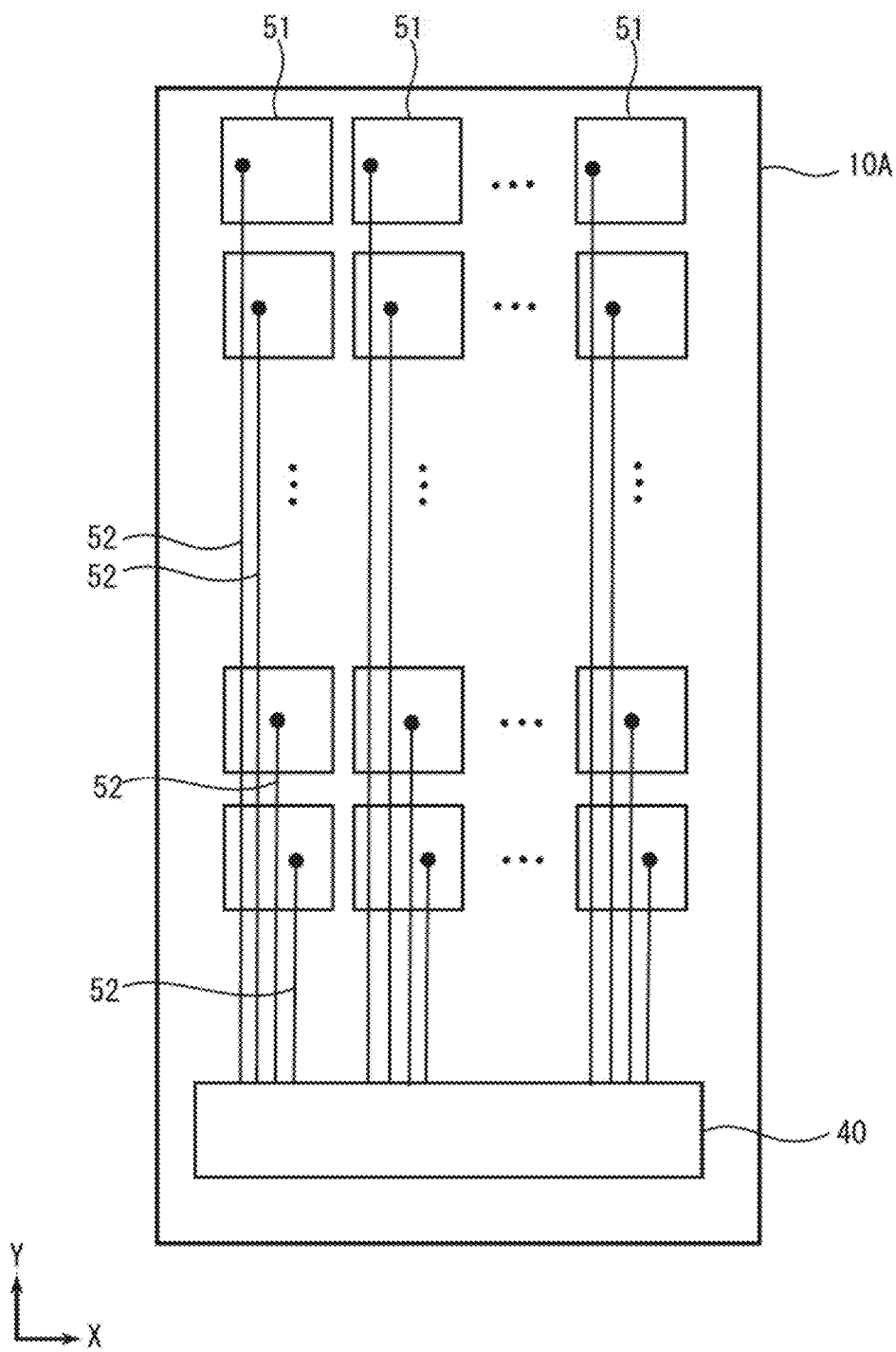
FIG. 14 schematically illustrates an exemplary arrangement of counter electrodes formed in an active matrix substrate in Modification Example 1.

FIG. 14 schematically illustrates an exemplary arrangement of counter electrodes formed in an active matrix substrate 10A in the present modification example. Though the illustration of data lines S and gate lines G is omitted in this diagram for convenience sake, data lines S, gate lines G, pixel electrodes, and switching elements are arranged in the active matrix substrate 10A, as is the case with the above-described embodiments. The counter electrodes 51 are provided on the liquid crystal layer side of the active matrix substrate 10A so as to overlap with the pixel electrodes. Each counter electrode 51 is in a rectangular shape, and a plurality of the same are arranged in matrix on the active matrix substrate 10A.

The active matrix substrate 10A is further provided with a controller 40. The controller 40 performs a controlling operation for displaying an image, and at the same time, performs a controlling operation for detecting a touch position.

The controller 40 and the counter electrodes 51 are connected by signal lines (counter electrode signal lines) 52 extending in the Y axis direction. In other words, the same number of signal lines 52 as the number of the counter electrodes 51 are formed on the active matrix substrate 10A.

The counter electrodes 51, in pair with the pixel electrodes, are used in image display control, as well as in touch position detection control.

The counter electrode 51 has a parasitic capacitance existed between the same and adjacent one of the counter electrodes 51, etc., and when a human finger or the like touches the display surface, a capacitance is generated between the counter electrode 51 and the human finger or the like, which causes an electrostatic capacitance to increase. In touch position detection control, the controller 40 supplies a touch driving signal to the counter electrodes 51 via the signal lines 52, and receives a touch detection signal via the signal lines 52. By doing so, the controller 40 detects changes in electrostatic capacitances at respective positions of the counter electrodes 51, thereby detecting a touch position. In other words, the signal lines 52 function as lines for transmission/reception of the touch driving signal and the touch detection signal.

In such a case of an in-cell type touch-panel-equipped display device, the touch position detection control period is set longer than the image display control period in some cases, in order to improve the touch position detection accuracy. In this case, the period while image data are written in each pixel is shorter, and therefore, differences among signal delays at the data lines easily affect the display. In the present modification example, differences among parasitic capacitances of the data lines are reduced, and therefore, it is unlikely that a signal delay would occur to a particular data line, whereby display defects can be suppressed.

As a structure of the lead-out line connecting the signal line 52 and the controller 40, the structure of the lead-out line in Embodiment 3 described above may be applied. Even if a touch driving signal or a touch detection signal having the same polarity is supplied to each signal line 52, parasitic capacitances are generated among the lead-out lines, as the lead-out lines of a plurality of signal lines 52 are arranged so as to overlap. Accordingly, with this configuration, parasitic capacitances can be reduced.

Modification Example 2

The active matrix substrates in Embodiments 1 to 3 described above may be applied to an organic electroluminescence (EL) display device. In this case, even if voltage signals having the same polarity are supplied to respective data lines (lines for writing data signals to circuits including TFTs that control electric current supplied to an OLED layer during a light emission period) in the active matrix substrate, parasitic capacitances are generated among lead-out lines, as the lead-out lines of a plurality of data lines are arranged so as to overlap. Accordingly, with this configuration, parasitic capacitances can be reduced.

The invention claimed is:

1. An active matrix substrate comprising:
   a substrate;
   a plurality of signal lines arranged so as to be parallel to one another in a display area provided on the substrate; and
   a plurality of lead-out lines that is connected with the signal lines outside the display area on the substrate, and supplies voltage signals to the signal lines connected thereto,
   wherein, outside the display area, the lead-out lines are separately arranged in at least three layers, the three layers being a bottommost line layer that is formed at a position closest to the substrate, a topmost line layer that is formed at a position farthest from the substrate, and an intermediate line layer that is formed between the bottommost line layer and the topmost line layer, and
   the lead-out lines provided in the bottommost line layer, the intermediate line layer, and the topmost line layer are arranged so that corresponding ones of the lead-out lines each provided in the bottommost line layer, the intermediate line layer, and the topmost line layer overlap with one another at a center portion in a width direction of the lead-out lines in a planar view, and a capacitance is formed between one of the signal lines connected with a corresponding one of the lead-out lines provided in the bottommost line layer, and one of the signal lines connected with a corresponding one of the lead-out lines provided in the topmost line layer.

2. The active matrix substrate according to claim 1, wherein the capacitance is made in a direction vertical with respect to the substrate.

3. The active matrix substrate according to claim 2, further comprising:
   a metal film that overlaps with one of the signal lines connected with a corresponding one of the lead-out lines provided in the bottommost line layer, and one of the signal lines connected with a corresponding one of the lead-out lines provided in the topmost line layer, the metal film being connected with either said one signal line connected with the lead-out line provided in the bottommost line layer, or said one signal line connected with the lead-out line provided in the topmost line layer,
   wherein the capacitance is made between said one signal line connected with the lead-out line provided in the bottommost line layer, and said one signal line connected with the lead-out line provided in the topmost line layer, via the metal film.

4. The active matrix substrate according to claim 1, wherein the capacitance is made in a direction horizontal with respect to the substrate.

5. The active matrix substrate according to claim 4, wherein one of the signal lines connected with a corresponding one of the lead-out lines provided in the bottommost line layer, and one of the signal lines connected with a corresponding one of the lead-out lines provided in the topmost line layer are provided so as to be closer to each other, than to one of the signal lines connected with a corresponding ones of the lead-out lines provided in the intermediate line layer.

6. The active matrix substrate according to claim 2, further comprising:
a seal-forming area for arranging a sealing member outside the display area,
wherein the capacitance is made in an area outside the display area, other than the seal-forming area.

7. The active matrix substrate according to claim 1, wherein the voltage signal is a voltage signal in accordance with image data of an image to be displayed in the display area,
to one of the signal lines that is connected with a corresponding one of the lead-out lines in the intermediate line layer, a voltage signal is supplied, the voltage signal having a polarity opposite to that of voltage signals supplied to ones of the signal lines that are arranged adjacent, in a horizontal direction of the substrate, to said one of the signal lines connected with the lead-out line in the intermediate line layer, and that are connected with corresponding ones of the lead-out lines provided in the bottommost line layer and the topmost line layer, respectively, and
the capacitance is made between ones of the signal lines to which voltage signals having different polarities are supplied, respectively, and that are connected with ones of the lead-out lines provided in the bottommost line layer and the topmost line layer, respectively.

8. An active matrix substrate comprising:
a substrate;
a plurality of signal lines arranged so as to be parallel with one another in a display area provided on the substrate; and
a plurality of lead-out lines that is connected with the signal lines outside the display area on the substrate, respectively, and supply voltage signals to the signal lines connected thereto,
wherein, outside the display area, the lead-out lines are separately arranged in at least three layers, the three layers being a bottommost line layer that is formed at position closest to the substrate, a topmost line layer that is formed at a position farthest from the substrate, and an intermediate line layer that is formed between the bottommost line layer and the topmost line layer, and
the lead-out lines provided in the bottommost line layer and the topmost line layer so that corresponding ones of the lead-out lines each provided in the bottommost line layer and the topmost line layer overlap with each other at a center portion in a width direction of the lead-out lines in a planar view, and the lead-out lines provided in the intermediate line layer are provided at such positions as to overlap with neither of the lead-out lines provided in the bottommost line layer and the topmost line layer.

9. The active matrix substrate according to claim 8, further comprising:
a seal-forming area for arranging a sealing member outside the display area,
wherein, in an area outside the display area, other than the seal-forming area, the lead-out lines provided in the bottommost line layer and the topmost line layer so that corresponding ones of the lead-out lines overlap with each other, and the lead-out lines provided in the intermediate line layer are provided at such positions as to overlap with neither of the lead-out lines provided in the bottommost line layer and the topmost line layer.

10. The active matrix substrate according to claim 8, wherein the voltage signal is a voltage signal in accordance with image data of an image to be displayed in the display area, and
to one of the signal lines that is connected with a corresponding one of the lead-out lines in the intermediate line layer, a voltage signal is supplied, the voltage signal having a polarity opposite to that of voltage signals supplied to ones of the signal lines that are arranged adjacent, in the horizontal direction of the substrate, to said one of the signal lines connected with the lead-out line in the intermediate line layer, and that are connected with corresponding ones of the lead-out lines provided in the bottommost line layer and the topmost line layer, respectively.

11. A display device comprising:
the active matrix substrate according to claim 1;
a counter substrate that is arranged so as to be opposed to the active matrix substrate, and has a color filter; and
a liquid crystal layer interposed between the active matrix substrate and the counter substrate.

12. A display device comprising:
the active matrix substrate according to claim 1;
a counter substrate that is arranged so as to be opposed to the active matrix substrate; and
a light emission layer interposed between the active matrix substrate and the counter substrate.

13. A touch-panel-equipped display device comprising:
the active matrix substrate according to claim 1,
wherein the active matrix substrate further includes:
a plurality of pixel electrodes;
a plurality of counter electrodes arranged so as to be opposed to the pixel electrodes, respectively; and
a plurality of counter electrode signal lines that are connected with the counter electrodes, respectively, and to which a voltage signal for detecting a touch position is supplied.

14. A display device comprising:
the active matrix substrate according to claim 8;
a counter substrate that is arranged so as to be opposed to the active matrix substrate, and has a color filter; and
a liquid crystal layer interposed between the active matrix substrate and the counter substrate.

15. A display device comprising:
the active matrix substrate according to claim 8;
a counter substrate that is arranged so as to be opposed to the active matrix substrate; and
a light emission layer interposed between the active matrix substrate and the counter substrate.

16. A touch-panel-equipped display device comprising:
the active matrix substrate according to claim 8,
wherein the active matrix substrate further includes:
a plurality of pixel electrodes;
a plurality of counter electrodes arranged so as to be opposed to the pixel electrodes, respectively; and
a plurality of counter electrode signal lines that are connected with the counter electrodes, respectively, and to which a voltage signal for detecting a touch position is supplied.

17. A active matrix substrate according to claim 1,
wherein among the corresponding ones of the lead-out lines each provided in the bottommost line layer, the intermediate line layer, and the topmost line layer, the lead-out line provided in the intermediate line layer overlaps with a single lead-out line provided in the bottommost line layer and a single lead-out line provided in the topmost line layer, in a planar view.

* * * * *